(12) United States Patent
Ikeda et al.

(10) Patent No.: US 9,072,158 B2
(45) Date of Patent: Jun. 30, 2015

(54) ELECTROMAGNETIC-RADIATION POWER-SUPPLY MECHANISM FOR EXCITING A COAXIAL WAVEGUIDE BY USING FIRST AND SECOND POLES AND A RING-SHAPED REFLECTION PORTION

(75) Inventors: Taro Ikeda, Nirasaki (JP); Yuki Osada, Nirasaki (JP); Shigeru Kasai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 231 days.

(21) Appl. No.: 13/551,122

(22) Filed: Jul. 17, 2012

(65) Prior Publication Data

US 2012/0299671 A1 Nov. 29, 2012

Related U.S. Application Data

(63) Continuation of application No. PCT/JP2011/050562, filed on Jan. 14, 2011.

(30) Foreign Application Priority Data

Jan. 18, 2010 (JP) .................. 2010-008510
Oct. 27, 2010 (JP) .................. 2010-241142

(51) Int. Cl.
*H01J 37/32* (2006.01)
*H05H 1/46* (2006.01)
*H01Q 15/00* (2006.01)

(52) U.S. Cl.
CPC ............ *H05H 1/46* (2013.01); *H01J 37/32192* (2013.01); *H01J 37/32211* (2013.01); *H01J 37/3222* (2013.01); *H01J 37/32229* (2013.01); *H01Q 15/0006* (2013.01); *H01J 37/32293* (2013.01); *H01J 37/32311* (2013.01); *H05H 2001/4622* (2013.01)

(58) Field of Classification Search
CPC ..... H01P 5/026; H01Q 9/0457; H01Q 9/0464
USPC .............. 315/111.21; 118/723 MW, 723 AN; 156/345.36, 345.48
See application file for complete search history.

(56) References Cited

U.S. PATENT DOCUMENTS

| | | | |
|---|---|---|---|
| 6,060,836 A | | 5/2000 | Maeno et al. |
| 6,791,274 B1 * | | 9/2004 | Bhutta et al. ............. 315/111.21 |
| 6,856,211 B2 | | 2/2005 | Yamada et al. |
| 2003/0178143 A1 * | | 9/2003 | Perrin ........................ 156/345.41 |
| 2005/0211382 A1 | | 9/2005 | Ishii et al. |
| 2006/0137613 A1 * | | 6/2006 | Kasai .................... 118/723 MW |
| 2009/0159214 A1 * | | 6/2009 | Kasai ....................... 156/345.41 |
| 2011/0018651 A1 | | 1/2011 | Ikeda et al. |
| 2011/0114261 A1 | | 5/2011 | Matsumoto et al. |

FOREIGN PATENT DOCUMENTS

| | | |
|---|---|---|
| JP | 2007-109457 | 4/2007 |
| KR | 10-0789796 B1 | 12/2007 |
| KR | 10-2008-0037077 A | 4/2008 |
| WO | WO 2008/013112 | 1/2008 |

* cited by examiner

*Primary Examiner* — Benny Lee
(74) *Attorney, Agent, or Firm* — Oblon, McClelland, Maier & Neustadt, L.L.P.

(57) ABSTRACT

An electromagnetic-radiation power-supply mechanism includes a microwave power introduction port provided on the side of the coaxial waveguide, a power line being connected to the microwave power introduction port; and a power supply antenna for radiating the electromagnetic wave power into the waveguide, the power supply antenna being connected to the power line. The power supply antenna includes an antenna body having a first pole connected to the power line and a second pole connected to an inner conductor of the waveguide; and a ring-shaped reflection portion extending from opposite sides of the antenna body.

9 Claims, 14 Drawing Sheets

ELECTROMAGNETIC-RADIATION POWER-SUPPLY MECHANISM FOR EXCITING A COAXIAL WAVEGUIDE BY USING FIRST AND SECOND POLES AND A RING-SHAPED REFLECTION PORTION

This application is a Continuation Application of PCT International Application No. PCT/JP2011/050562 filed on Jan. 14, 2011, which designated the United States.

FIELD OF THE INVENTION

The present invention relates to an electromagnetic-radiation power-supply mechanism and a microwave introduction mechanism.

BACKGROUND OF THE INVENTION

In a manufacturing process of a semiconductor device or a liquid crystal display, a plasma processing apparatus such as a plasma etching apparatus, a plasma CVD film forming apparatus or the like is used to perform a plasma process such as an etching process, a film forming process or the like on a target substrate to be processed such as a semiconductor wafer, a glass substrate or the like.

Recently, as for the plasma processing apparatus, some attention has been paid to a RLSA (Radial Line Slot Antenna) microwave plasma processing apparatus capable of uniformly generating a surface wave plasma in a high density and at a low electron temperature (see, e.g., Japanese Patent Application Publication No. 2007-109457).

The RLSA microwave plasma processing apparatus includes a planar antenna (a radial line slot antenna) provided at an upper portion of a chamber, the planar antenna having slots formed in a predetermined pattern. A microwave generated from a microwave generator passes through a coaxial waveguide and is radiated into a chamber through the slots of the planar antenna. By a thus-produced microwave electric field, a gas introduced into the chamber is turned into a plasma and, thus, a target object, e.g., a semiconductor wafer, is processed by the plasma.

Further, there is suggested a plasma processing apparatus having a microwave plasma source for dividing a microwave into a plurality of microwaves, amplifying the microwaves by a solid state amplifier, transmitting the microwaves to the chamber through a plurality of antenna modules, each of which including a planar antenna having slots as in the case of the coaxial waveguide, and spatially combining the microwaves in the chamber (International Patent Application Publication No. 2008/013112 pamphlet (WO2008/013112A).

In order to supply an electromagnetic wave power, e.g., a microwave power, to the coaxial waveguide, a power supply port is generally provided in an extension of the coaxial waveguide, and the power is supplied therefrom, as described in WO2008/013112A.

However, due to the design of the apparatus, a driving mechanism or another member may be disposed at the portion corresponding to the extension of the coaxial waveguide. In that case, it is not possible to effectively supply the power.

SUMMARY OF THE INVENTION

In view of the above, the present invention provides an electromagnetic-radiation power-supply mechanism and a microwave introduction mechanism using same, capable of effectively supplying an electromagnetic wave power to a coaxial waveguide even when it is not able to supply the electromagnetic wave power from an extension of the coaxial waveguide.

In accordance with a first aspect of the present invention, there is provided an electromagnetic-radiation power-supply mechanism for supplying an electromagnetic wave power to a coaxial waveguide, including a microwave power introduction port provided on a side of the coaxial waveguide, a power line being connected to the microwave power introduction port; and a power supply antenna for radiating the electromagnetic wave power into the waveguide, the power supply antenna being connected to the power line, wherein the power supply antenna includes: an antenna body having a first pole connected to the power line and a second pole connected to an inner conductor of the waveguide; and a ring-shaped reflection portion extending from opposite sides of the antenna body along an outer side of the inner conductor, and a first electromagnetic wave that is incident on the antenna body and a second electromagnetic wave reflected by the reflection portion form a standing wave, and the electromagnetic wave power propagates in the waveguide by chain reactions of an induced electric field and an induced magnetic field caused by the standing wave.

In accordance with the first aspect, the electromagnetic-radiation power-supply mechanism may further includes a reflecting plate provided at a side of the waveguide opposite to a power supply direction thereof, wherein the electromagnetic wave power supplied from the power supply antenna is reflected by the reflecting plate and propagates in the waveguide. Further, the electromagnetic-radiation power-supply mechanism may further include a wave retardation member, provided between the reflecting plate and the power supply antenna, for shortening an effective wavelength of an electromagnetic wave.

In accordance with a second aspect of the present invention, there is provided a microwave introduction mechanism used for a surface wave plasma source for generating a surface wave plasma in a chamber, including a coaxial waveguide; a power introduction port provided on a side of the coaxial waveguide, a coaxial line being connected to the power introduction port; a power supply antenna for radiating an electromagnetic wave power into the waveguide, the power supply antenna being connected to an inner conductor of the coaxial line; and an antenna unit having a microwave radiation antenna for radiating a microwave supplied to the waveguide into the chamber, wherein the power supply antenna includes: an antenna body having a first pole connected to the coaxial line and a second pole which contacts an inner conductor of the waveguide; and a reflection portion formed in a ring shape and extending from opposite sides of the antenna body along an outer side of the inner conductor, and a first electromagnetic wave that is incident on the antenna main body and a second electromagnetic wave reflected by the reflection portion to form a standing wave, and the electromagnetic wave power propagates in the waveguide by chain reactions of an induced electric field and an induced magnetic field caused by the standing wave.

In accordance with the second aspect, the microwave introduction mechanism may further include an incident wave/reflected wave monitor including a directional coupler provided in the waveguide, for extracting a current of either an incident wave directed to the chamber or a reflected wave which returns by being reflected among microwaves propagating in the waveguide and a detector for detecting the current extracted by the directional coupler.

In this case, the directional coupler may includes a slit formed at an outer conductor of the coaxial waveguide; a plate-shaped conductor provided in the slit; a pair of conductive pins for extracting a current flowing in the plate-shaped conductor; and a regulator including a conductor which is provided outside the outer conductor to correspond to the plate-shaped conductor in such a way that a distance between the regulator and the plate-shaped conductor is adjustable, wherein the slit is formed in such a shape that a portion of the slit facing the regulator is widened to correspond to the regulator.

Further, the microwave introduction mechanism may further include a tuner, provided between the power introduction port and the antenna unit, for matching an impedance of a load in the chamber to a characteristic impedance of a microwave power supply installed at the surface wave plasma source, wherein the tuner includes an annular slag made of a dielectric material, the annular slag being provided between the outer conductor and the inner conductor to be movable along a lengthwise direction of the inner conductor, and the directional coupler is provided between the power introduction port and the slag and/or between the slag and the antenna unit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof, where like features in the different drawing figures are designated by the same reference labels or descriptions.

(Configuration of Surface Wave Plasma Processing Apparatus)

Figure 1:
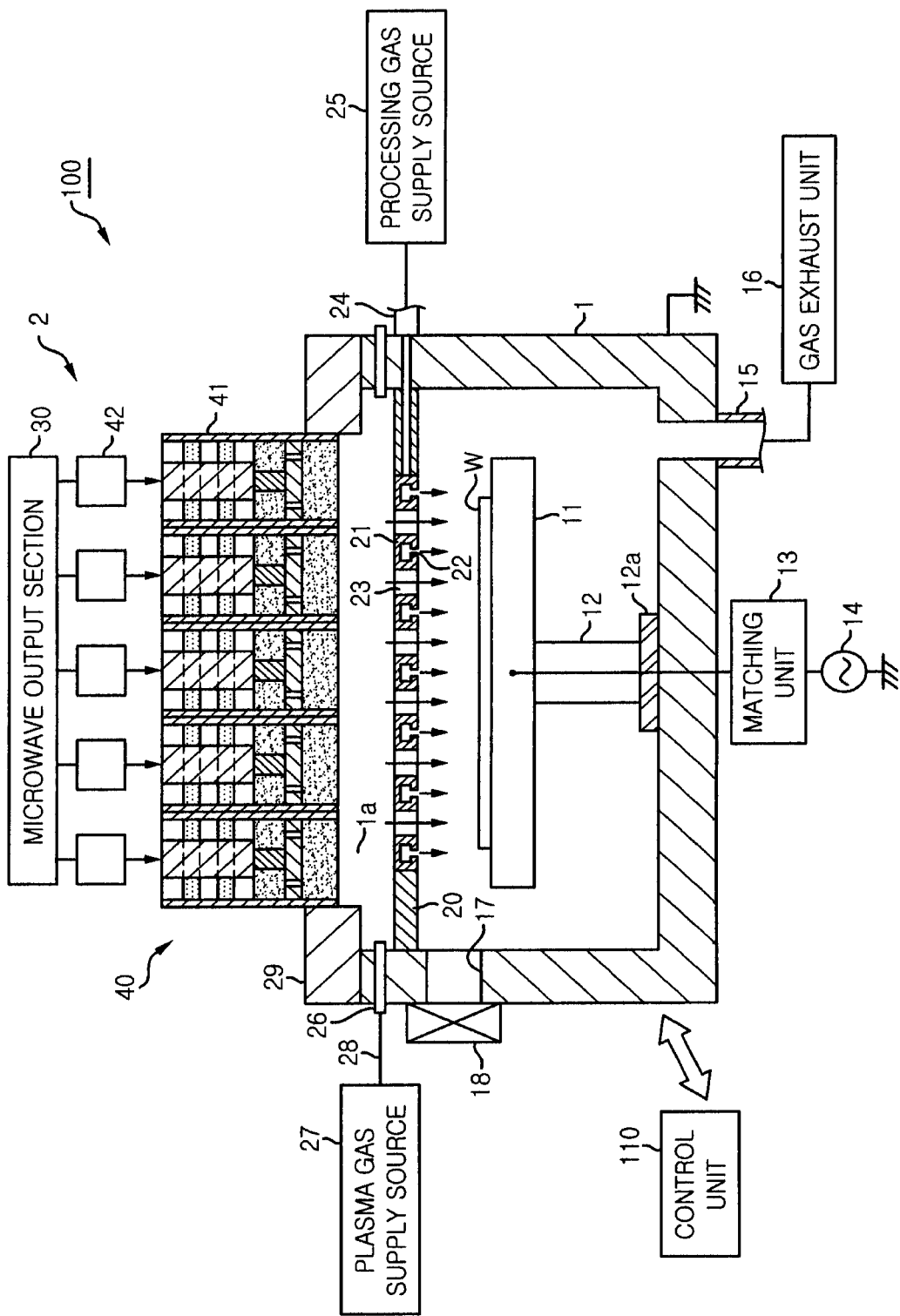
FIG. 1 is a cross sectional view showing a schematic configuration of a surface wave plasma processing apparatus including a microwave introduction mechanism to which an electromagnetic-radiation power-supply mechanism is applied in accordance with an embodiment of the present invention.
Figure 2:
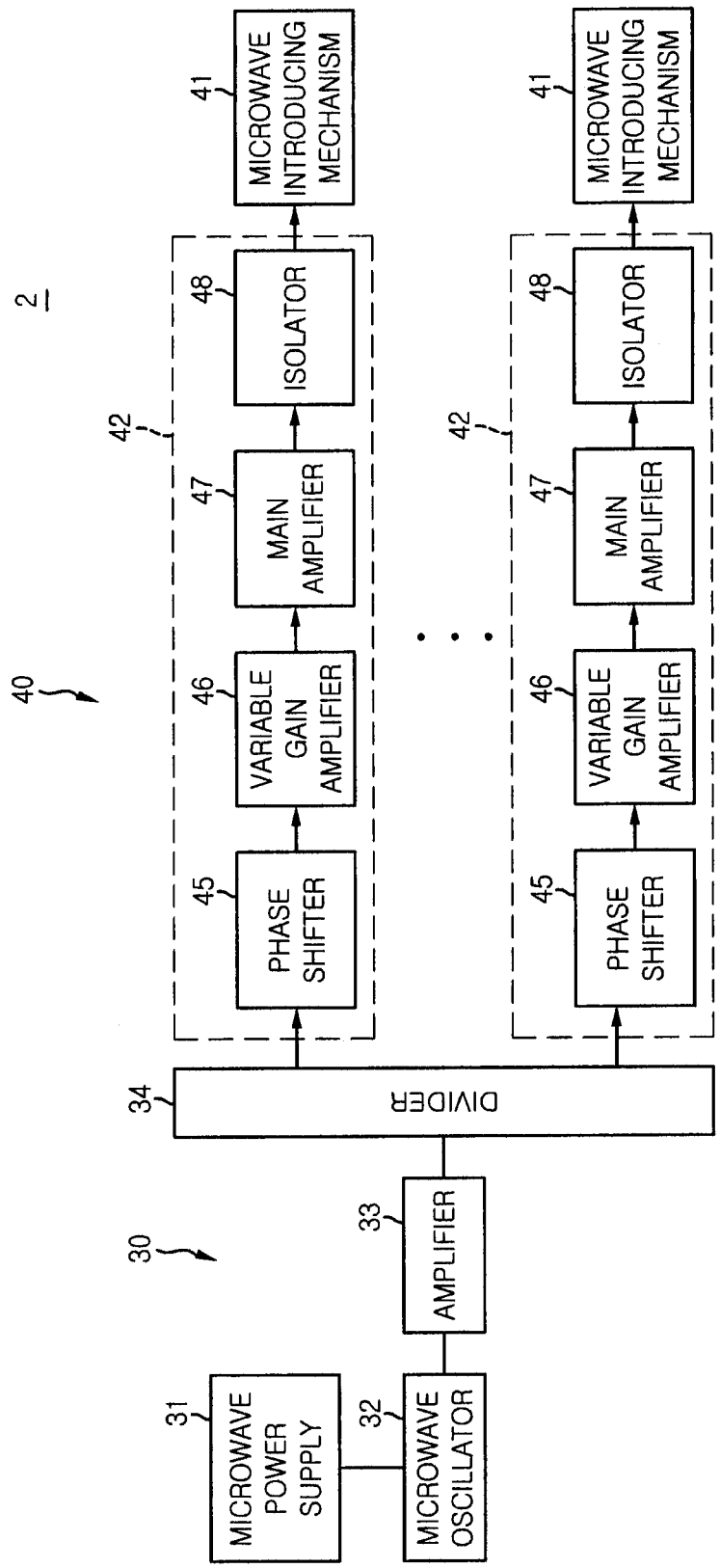
FIG. 2 shows a configuration of a microwave plasma source having the microwave introduction mechanism shown in FIG. 1.

FIG. 1 is a cross sectional view showing a schematic configuration of a surface wave plasma processing apparatus including a microwave introduction mechanism to which an electromagnetic-radiation power-supply mechanism is applied in accordance with an embodiment of the present invention. FIG. 2 shows a configuration of a microwave plasma source having the microwave introduction mechanism shown in FIG. 1.

As shown in FIG. 1, a surface wave plasma processing apparatus 100 is configured as, e.g., a plasma etching apparatus for performing on a wafer an etching process as a plasma process, and includes a substantially cylindrical airtight chamber 1 made of a metal such as aluminum, stainless steel or the like, the chamber 1 being grounded; and a microwave plasma source 2 for generating a microwave plasma in the chamber 1. An opening 1a is formed at an upper portion of the chamber 1, and the microwave plasma source 2 is disposed so as to face the inside of the chamber 1 through the opening 1a.

Within the chamber 1, a susceptor 11 for horizontally supporting a wafer W as a target object to be processed is supported by a cylindrical support member 12 extended upwardly from a bottom center of the chamber 1 via an insulating member 12a. The susceptor 11 and the support member 12 may be made of, e.g., aluminum having an alumite-processed (anodically oxidized) surface.

Although they are not illustrated, the susceptor 11 is provided with an electrostatic chuck for electrostatically attract the wafer W; a temperature control mechanism, a gas channel for supplying a heat transfer gas to a backside of the wafer W; elevation pins which are raised and lowered to transfer the wafer W; and the like. A high frequency bias power supply 14 is electrically connected to the susceptor 11 via a matching unit 13. By supplying a high frequency power from the high frequency bias power supply 14 to the susceptor 11, ions in the plasma are attracted toward the wafer W.

A gas exhaust line 15 is connected to a bottom portion of the chamber 1, and a gas exhaust unit 16 including a vacuum pump (not shown) is connected to the gas exhaust line 15. By operating the gas exhaust unit 16, the chamber 1 can be exhausted and depressurized to a predetermined vacuum level at a high speed. Provided at a sidewall of the chamber 1 are a loading/unloading port 17 for loading and unloading the wafer W and a gate valve 18 for opening and closing the loading/unloading port 17.

A shower plate 20 for injecting a processing gas, i.e., a plasma etching gas, toward the wafer W is horizontally provided above the susceptor 11 in the chamber 1. The shower plate 20 has lattice-shaped gas channels 21 and a plurality of gas injection holes 22 formed at the gas channels 21. Space portions 23 are defined between the lattice-shaped gas channels 21. A line 24 extending to the outside of the chamber 1 is connected to the gas channels 21 of the shower plate 20, and a processing gas supply source 25 is connected to the line 24.

Meanwhile, a ring-shaped plasma gas introducing member 26 is provided above the shower plate 20 of the chamber 1 along the wall of the chamber, and a plurality of gas injection holes are formed in an inner circumferential portion of the plasma gas introducing member 26. A plasma gas supply source 27 for supplying a plasma gas is connected to the plasma gas introducing member 26 via a line 28. As for the plasma gas, Ar gas or the like is preferably used.

The plasma gas introduced into the chamber 1 from the plasma gas introducing member 26 is turned into a plasma by the microwave introduced into the chamber 1 from the microwave plasma source 2. The processing gas injected through the gas injection holes 22 of the shower plate 20 is excited by the plasma passing through the space portions 23 of the shower plate 20 to thereby generate a plasma of the processing gas.

The microwave plasma source 2 is held by a support ring 29 provided at an upper portion of the chamber 1, and a space therebetween is airtightly sealed. As shown in FIG. 2, the microwave plasma source 2 includes a microwave output section 30 for dividedly outputting microwaves through a plurality of channels; and a microwave supply unit 40 for transmitting the microwave outputted from the microwave output section 30 and radiating it to the chamber 1.

The microwave output section 30 has a microwave power supply 31; a microwave oscillator 32; an amplifier 33 for amplifying an oscillated microwave; and a divider 34 for dividing the amplified microwave into a plurality of microwaves.

The microwave oscillator 32 performs, e.g., PLL (Phase Locked Loop) oscillation, to generate a microwave of a predetermined frequency (e.g., 915 MHz). The divider 34 divides the microwave amplified by amplifier 33 while matching the impedance between an input side and an output side such that the loss of the microwave can be minimized. The frequency of the microwave raging from 700 MHz to 3 GHz may be used in addition to 915 MHz.

The microwave supply unit 40 has a plurality of amplifier sections 42 for mainly amplifying the divided microwaves and microwave introduction mechanisms 41 which are respectively connected to the amplifier sections 42.

Each of the amplifier sections 42 has a phase shifter 45; a variable gain amplifier 46; a main amplifier 47 constituting a solid state amplifier; and an isolator 48.

The phase shifter 45 is configured to shift phases of the microwaves, and the radiation characteristics can be modulated by controlling the phase shifter 45. For example, the directivity of the microwaves can be controlled by adjusting the phase in each of the antenna modules to thereby change the plasma distribution, and the circularly polarized waves can be obtained by shifting the phase by about 90° between adjacent antenna modules. Further, the phase shifter 45 can be used to control delay characteristics between components in the amplifier and to perform spatial combination in the tuner. However, the phase shifter 45 may not be provided when it is unnecessary to modulate the radiation characteristics or control the delay characteristics between the components in the amplifier.

The variable gain amplifier 46 serves to adjust the variation in the antenna modules or the plasma intensity by controlling power levels of the microwaves inputted to the main amplifier 47. By controlling the variable gain amplifier 46 for each of the antenna modules, it is possible to variably adjust the distribution of the generated plasma.

The main amplifier 47 constituting the solid state amplifier may have, e.g., an input matching circuit; a semiconductor amplifying device; an output matching circuit; and a high Q resonant circuit.

The isolator 48 serves to separate the microwave reflected by the microwave introduction mechanism 41 toward the main amplifier 47 and has a circulator and a dummy load (coaxial terminator). The circulator guides the microwave reflected by an antenna unit 43, which will be described later, to the dummy load; and the dummy load converts the reflected microwave guided by the circulator into heat.

Hereinafter, the microwave introduction mechanism 41 will be described in detail.

Figure 3:
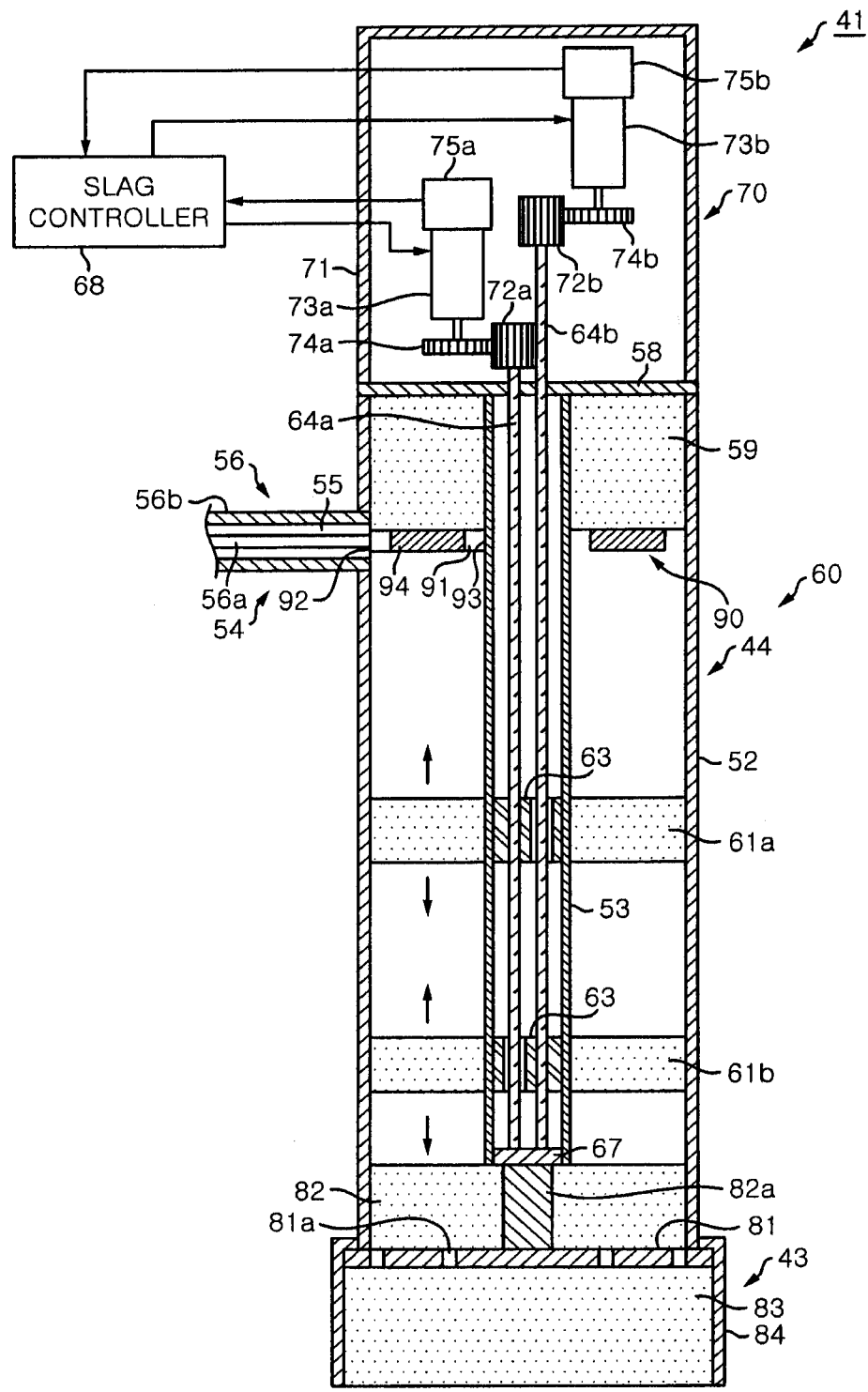
FIG. 3 is a vertical cross sectional view showing the microwave introduction mechanism shown in FIG. 1.
Figure 4:
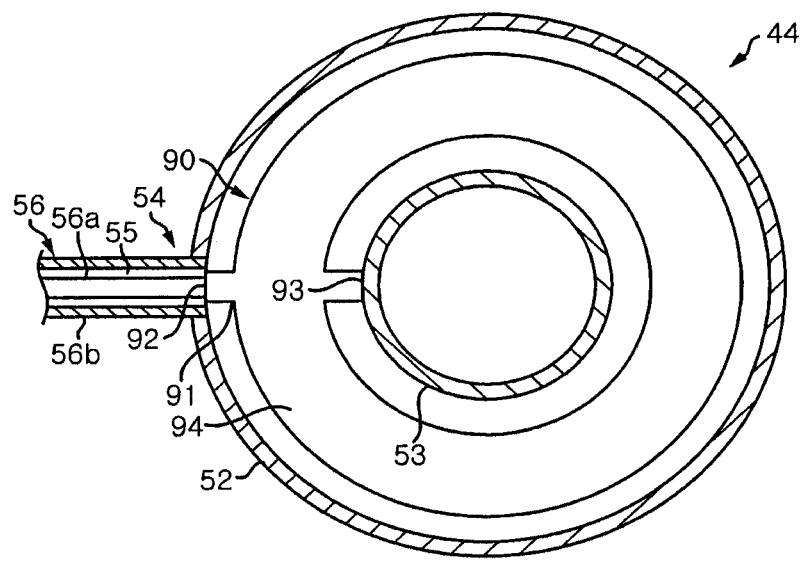
FIG. 4 is a horizontal cross sectional view showing a power supply mechanism of the microwave introduction mechanism.

FIG. 3 is a vertical cross sectional view of the microwave introduction mechanism 41, and FIG. 4 is a horizontal cross sectional view showing a power supply mechanism of the microwave introduction mechanism 41. The microwave introduction mechanism 41 (FIG. 3) has a coaxial waveguide 44 for transmitting the microwaves; and the antenna unit 43 (FIG. 3) for radiating the microwaves transmitted through the waveguide 44 into the chamber 1 (FIG. 1). The microwaves radiated into the chamber 1 from the microwave introduction mechanism 41 are combined in the space in the chamber 1 to thereby generate a surface wave plasma in the chamber 1.

The waveguide 44 includes a cylindrical outer conductor 52; and a rod-shaped inner conductor 53 coaxially arranged within the cylindrical outer conductor 52, and the antenna unit 43 is provided at an end portion of the waveguide 44. In the waveguide 44, the inner conductor 53 is used for power supply, and an outer conductor 52 is used for a ground. A reflecting plate 58 (FIG. 3) is provided at the upper ends of the outer conductor 52 and the inner conductor 53.

A power supply mechanism 54 for supplying a microwave (electromagnetic wave) is provided at a base end side of the waveguide 44. The power supply mechanism 54 includes a microwave power introduction port 55 provided at a side surface of the waveguide 44 (outer conductor 52) to introduce a microwave power. Connected to the microwave power introduction port 55 is a coaxial line 56 including an inner conductor 56a and an outer conductor 56b which serves as a power supply line for supplying the microwave amplified by the amplifier section 42. A power supply antenna 90 extending horizontally toward the inside of the outer conductor 52 is connected to a leading end of the inner conductor 56a of the coaxial line 56.

The power supply antenna 90 is formed as a microstrip line formed on a PCB substrate, e.g., a printed circuit board. A wave retardation member 59 (FIG. 3) made of e.g., a polytetrafluoroethylene dielectric material such as Teflon (Registered Trademark) is provided between the reflecting plate 58 and the power supply antenna 90 in order to shorten an effective wavelength of a reflection wave.

In the case of using a microwave with a high frequency of, e.g., 2.45 GHz, the wave retardation member 59 may not be provided. At this time, an electromagnetic wave radiated from the power supply antenna 90 is reflected by the reflecting plate 58, so that a maximum electromagnetic wave is transmitted to the coaxial waveguide 44. In that case, a distance from the power supply antenna 90 to the reflecting plate 58 is substantially $n*\lambda g/4$, $\lambda g$ being a guide wavelength and n being an odd number. However, this may not be applied to a microwave with a low frequency due to limit in the diametrical direction. In that case, it is preferable to optimize a shape of the power supply antenna 90 such that an antinode of an electromagnetic wave generated from the power supply antenna 90 is formed below the power supply antenna 90 without being formed at the power supply antenna 90.

As shown in FIG. 4, the power supply antenna 90 includes an antenna body 91 having a first pole 92 connected to the inner conductor 56a of the coaxial line 56 in the microwave power introduction port 55 and to which an electromagnetic wave is supplied and a second pole 93 for radiating the supplied microwave (electromagnetic wave); and a ring-shaped reflecting portion 94 extending from both sides of the antenna body 91 along the outer side of the inner conductor 53. The electromagnetic wave that is incident on the antenna body 91 and the electromagnetic wave reflected by the reflecting portion 94 are used to form a standing wave. The second pole 93 of the antenna body 91 is brought contact into the inner conductor 53.

By radiating a microwave (electromagnetic wave) from the power supply antenna 90, a microwave power is supplied to a space between the outer conductor 52 and the inner conductor 53. The microwave power supplied to the power supply mechanism 54 propagates toward the antenna unit 43.

As shown in FIG. 3, a tuner 60 is provided in the waveguide 44. The tuner 60 serves to match an impedance of a load (plasma) in the chamber 1 to a characteristic impedance of the microwave power supply in the microwave output section 30. The tuner 60 includes two slags 61a and 61b provided between the outer conductor 52 and the inner conductor 53, the two slags 61a and 61b being vertically movable; and a slag driving unit 70 provided at an outer side (upper side) of the reflecting plate 58.

The slag 61a is provided at the slag driving unit 70 side, and the slag 61b is provided at the antenna unit 43 side. Further, two slag moving shafts 64a and 64b used for moving the slags 61a and 61b which are formed of screw rods each having, e.g., a trapezoidal thread are provided in the inner space of the inner conductor 53 along the longitudinal direction.

Figure 5:
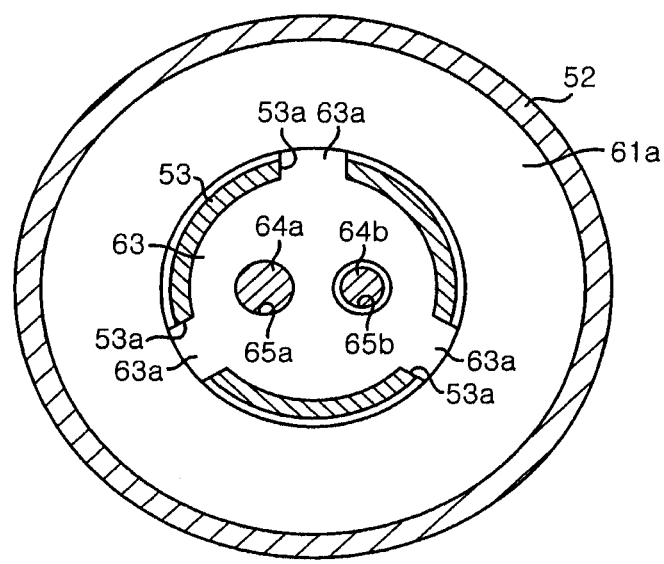
FIG. 5 is a horizontal cross sectional view showing a slag and a sliding member in a main body of a tuner.

As shown in FIG. 5, the slag 61a made of a dielectric material has a circular ring shape, and a sliding member 63 made of a resin having a smoothness is inserted into the slag 61a. The sliding member 63 has a screw hole 65a to which the slag moving shaft 64a is screw-coupled; and a through hole 65b through which the slag moving shaft 64b is inserted.

Although the slag 61b has a screw hole (not shown) and a through hole (not shown) as in the case of the slag 61a, the screw hole (not shown) is screw-coupled to the slag moving shaft 64b and the slag moving shaft 64a is inserted through the through hole (not shown) unlike the case of the slag 61a. Accordingly, them slag 61a is vertically moved by rotating the slag moving shaft 64a, and the slag 61b is vertically moved by rotating the slag moving shaft 64b. In other words, the slags 61a and 61b are vertically moved by a screw mechanism including the slag moving shafts 64a and 64b and the sliding member 63.

Figure 6:
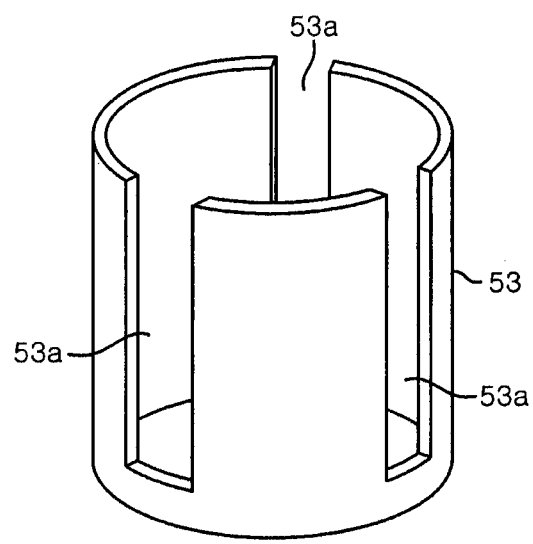
FIG. 6 is a perspective view showing an inner conductor in the main body of the tuner.

As shown in FIG. 6, three slits 53a are formed at the inner conductor 53 along the longitudinal direction thereof to be spaced apart from each other at a regular interval. Meanwhile, three protrusions 63a are provided at the sliding member 63 to be spaced apart from each other at a regular interval so as to correspond to the slits 53a as shown in FIG. 5. The sliding member 63 is fitted into the slags 61a and 61b in a state where the protrusions 63a are brought into contact with the inner circumferential portions of the slags 61a and 61b.

The outer circumferential surface of the sliding member 63 comes into contact with the inner circumferential surface of the inner conductor 53 without a clearance therebetween and, thus, the sliding member 63 is vertically moved while sliding along the inner conductor 53 by rotating the slag moving shafts 64a and 64b as shown in FIG. 5. In other words, the inner circumferential surface of the inner conductor 53 functions as a slide guide of the slags 61a and 61b. A width of the slits 53a is preferably set to about 5 mm or less. Hence, as will be described later, the microwave power leaking into the inner conductor 53 can be substantially eliminated, and the high radiation efficiency of the microwave power can be maintained.

As for a resin material of the sliding member 63, it is preferable to employ a relatively easily processible resin having a high smoothness, e.g., a polyphenylene sulfide (PPS) resin.

Returning to FIG. 3, the slag moving shafts 64a and 64b extend through the reflecting plate 58 to the slag driving unit 70. A bearing (not shown) is provided between the slag moving shafts 64a and 64b and the reflecting plate 58. Further, a bearing 67 made of a conductor is provided at a lower end of the inner conductor 53, and the lower ends of the slag moving shafts 64a and 64b are rotatably supported by the bearing 67.

The slag driving unit 70 includes a housing body 71, and the slag moving shafts 64a and 64b are extended into the housing body 71. Gears 72a and 72b are attached to the upper ends of the slag moving shafts 64a and 64b. The slag driving unit 70 includes a motor 73a for rotating the slag moving shaft 64a; and a motor 73b for rotating the slag moving shaft 64b. The gear 74a is attached to a shaft of the motor 73a, and the gear 74b is attached to a shaft of the motor 73b. The gear 74a is engaged with the gear 72a, and the gear 74b is engaged with the gear 72b. Accordingly, the slag moving shaft 64a is rotated by the motor 73a via the gears 74a and 72a, and the slag moving shaft 64b is rotated by the motor 73b via the gears 74b and 72b. The motors 73a and 73b are, e.g., stepping motors.

The slag moving shaft 64b is longer than the slag moving shaft 64a and extends further upward than the slag moving shaft 64a. Therefore, the gears 72a and 72b are vertically offset from each other, and the motors 73a and 73b are vertically offset from each other. Hence, the space of the power transmission mechanism including the motors, the gears and the like can be reduced, and the housing body 71 accommodating such components can have the same diameter as that of the outer conductor 52.

Increment encoders 75a and 75b for detecting positions of the slags 61a and 61b are provided above the motors 73a and 73b so as to be directly coupled to output shafts thereof, respectively. The absolute positions thereof are detected by the increment encoders in the following sequence.

First, the slag moving shaft 64a is slowly rotated to move the slag 61a at a constant speed while monitoring the counter of the encoder 75a. When the slag 61a reaches mechanical stop (not shown), the motor 73a is stepped out and stopped. The stop of the motor 73a can be detected by recognizing that the count of the encoder 75a is not changed. The position of the slag 61a at that time, or the position offset therefrom by a predetermined number of pulses is set as the origin. The absolute position of the slag 61a can be detected by counting the number of pulses from the origin based on the position of the origin. Similarly, the absolute position of the slag 61b can be detected by detecting the origin.

The positions of the slags 61a and 61b are controlled by a slag controller 68. Specifically, the slag controller 68 sends control signals to the motors 73a and 73b based on an impedance of the input terminal detected by an impedance detector (not shown) and position informations related to the slags 61a and 61b detected by the encoders 75a and 75b. Then, the impedance is adjusted by controlling the positions of the slags 61a and 61b. The slag controller 68 performs impedance matching such that an impedance of a terminal is adjusted to, e.g., about 50Ω. When only one of two slugs is moved, a trajectory passing through the origin of the smith chart is drawn. When both of the two slugs are moved, only the phase is rotated.

The antenna unit 43 serves as a microwave radiation antenna, and includes a planar slot antenna 81 having slots 81a. The antenna unit 43 further includes a wave retardation member 82 provided on the top surface of the planar slot antenna 81. A cylindrical member 82a made of a conductor is extended through the center of the wave retardation member 82 to connect the bearing 67 and the planar slot antenna 81. Accordingly, the inner conductor 53 is connected to the planar slot antenna 81 via the bearing 67 and the cylindrical member 82a. The lower end of the outer conductor 52 is extended to the planar slot antenna 81, and the vicinity of the wave retardation member 82 is covered by the outer conductor 52. The planar slot antenna 81 and a ceiling plate 83 to be described later are covered by a coating conductor 84.

The wave retardation member 82 has a dielectric constant greater than that of vacuum and is made of e.g., quartz, ceramic, a fluorine-based resin or a polyimide-based resin. As an example of the fluorine-based resin, polytetrafluoroethylene or the like may be employed. The wave retardation member 82 serves to reduce a size of the antenna by shortening the wavelength of the microwave because the wavelength of the microwave is increased in the vacuum. The wave retardation member 82 can adjust the phases of the microwaves depending on its thickness. By adjusting the thickness of the wave retardation member 82 such that an antinode of the standing wave is formed at the planar slot antenna 81, it is possible to maximize the radiation energy of the planar slot antenna 81 while minimizing the reflection.

Figure 7:
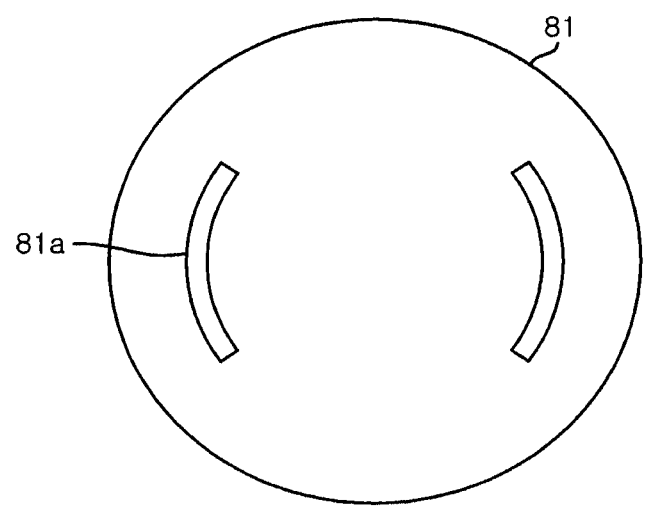
FIG. 7 is a horizontal cross sectional view showing a planar slot antenna installed at the microwave introduction mechanism.

A dielectric member for vacuum sealing, e.g., the ceiling plate 83 made of quart, ceramic or the like, is provided at a further leading end side of the planar slot antenna 81. The microwave amplified by the main amplifier 47 passes through the gap between peripheral walls of the inner conductor 53 and the outer conductor 52, and then is radiated from the slots 81a of the planar slot antenna 81 into the space in the chamber 1 through the ceiling plate 83. As shown in FIG. 7, the slots 81a in slot antenna 81 are preferably formed in a fan shape. The number of the slots 81a is preferably two as illustrated or four. Hence, the microwave can be effectively transmitted in a TEM mode.

In the present embodiment, the main amplifier 47, the tuner 60, and the planar slot antenna 81 are arranged close to one another. Further, the tuner 60 and the planar slot antenna 81 form a lumped constant circuit within ½ wavelength. Moreover, the planar slot antenna 81, the wave retardation member 82, and the ceiling plate 83 are set to have a combined resistance of about 50Ω. Therefore, the tuner 60 can directly tune the plasma load and effectively transmit an energy to the plasma.

As shown in FIG. 1, the components in the surface wave plasma processing apparatus 100 are controlled by a control unit 110 including a micro processor. The control unit 110 includes a display, an input device, a storage unit for storing process sequences of the surface wave plasma processing apparatus 100 and process recipes as control parameters, and the like. The control unit 110 controls the plasma processing apparatus in accordance with a selected process recipe.

(Operation of Surface Wave Plasma Processing Apparatus)

Hereinafter, an operation of the surface wave plasma generating apparatus 100 will be described.

First, in conjunction with FIG. 1, a wafer W is loaded into the chamber 1 and mounted on the susceptor 11. While plasma gas, e.g., Ar gas, is introduced from the plasma gas supply source 27 into the chamber 1 through the line 28 and the plasma gas introducing member 26, a microwave is introduced from the microwave plasma source 2 into the chamber 1, thereby generating a surface wave plasma.

After the surface wave plasma is generated, a processing gas, e.g., an etching gas such as $Cl_2$ gas or the like, is injected from the processing gas supply source 25 into the chamber 1 through the line 24 and the shower plate 20. The injected processing gas is excited and turned into a plasma by the plasma passing through the space portions 23 of the shower plate 20. A plasma process, e.g., an etching process, is performed on the wafer W by the plasma of the processing gas.

In conjunction with FIG. 2, in order to generate the surface wave plasma, in the microwave plasma source 2, a microwave power oscillated by the microwave oscillator 32 of the microwave output section 30 is amplified by the amplifier 33 and divided into a plurality of microwave powers by the divider 34. The divided microwave powers are transmitted to the microwave supply unit 40. In the microwave supply unit 40, the microwave powers are individually amplified by the main amplifier 47 constituting a solid state amplifier and are then supplied to the waveguide 44 of the microwave introduction mechanism 41. The impedance is automatically matched in the tuner 60 and, in a state where the power reflection substantially does not occur, the microwave powers are radiated into the chamber 1 through the planar slot antenna 81 and the ceiling plate 83 of the antenna unit 43 and are then spatially combined therein.

At this time, in conjunction with FIG. 3, the slag driving unit 70 is provided at the portion corresponding to the extension of the shaft of the coaxial waveguide 44, so that the microwave power supplied to the waveguide 44 cannot be started from the extension of the shaft of the waveguide 44.

Therefore, in the present embodiment, there is provided the power supply mechanism 54 having the microwave power introduction port 55 disposed at the side surface of the waveguide 44 and the power supply antenna 90 for radiating an electromagnetic wave into the waveguide 44 from the inner conductor 56a of the power-supply coaxial line 56 which is connected to the microwave power introduction port 55.

In that case, when the microwave (electromagnetic wave) transmitted from the coaxial line 56 reaches the first pole 92 of the power supply antenna 90 through the microwave power introduction port 55 provided at the side surface of the waveguide 44, the microwave (electromagnetic wave) propagates along the antenna body 91 and is radiated from the second pole 93 disposed at the leading end of the antenna body 91. Further, the microwave (electromagnetic wave) propagating in the antenna body 91 is reflected by the reflecting portion 94 and combined with an incident wave, thereby forming a standing wave. When the standing wave is formed at the position at which the power supply antenna 90 is disposed, a magnetic field is induced along the outer wall of the inner conductor 53 and, thus, an electromagnetic field is induced. Due to such chain reactions, the microwave (electromagnetic wave) propagates in the waveguide 44 and is transmitted to the antenna unit 43.

Accordingly, even when the supply of the microwave (electromagnetic wave) cannot be started from the extension of the coaxial waveguide 44, the microwave (electromagnetic wave) can be supplied to the waveguide 44.

In other words, in accordance with the present embodiment, there is provided the power supply mechanism 54 having the microwave power introduction port 55 serving as a power introduction port provided at the side surface of the waveguide 44 and the power supply antenna 90 for radiating a microwave power (an electromagnetic wave power) into the waveguide 44 from the coaxial line 56 serving as a power supply line connected to the microwave power introduction port 55. The power supply antenna 90 includes the antenna body 91 having a first pole 92 connected to the inner conductor 56a of the coaxial line 56 serving as the power supply line and a second pole 93 which is brought into contact into the inner conductor 53 of the waveguide 44; and a ring-shaped reflecting portion 94 extending from opposite sides of the antenna body 91 along the outer side of the inner conductor 53. The electromagnetic wave (microwave) that is incident on the antenna body 91 and the electromagnetic wave (microwave) reflected by the reflecting portion 94 are used to form a standing wave. Due to chain reactions of an induced electric field and an induced magnetic field caused by the standing wave, the electromagnetic wave power propagates in the waveguide 44. Hence, the electromagnetic wave power can be supplied to the waveguide even when the supply of the electromagnetic wave power cannot be started from the extension of the shaft of the coaxial waveguide.

At this time, the second pole 93 of the power supply antenna 90 is brought into contact into the inner conductor 53 of the waveguide 44, and the reflecting portion 94 is formed in a ring shape. Therefore, there is no joint portion, which prevents a strong electric field which may occur at the joint portion. Accordingly, it is possible to effectively and uniformly supply the microwave (electromagnetic wave) power.

Further, in the waveguide 44, a maximum microwave (electromagnetic wave) power can be transmitted to the waveguide 44 having a coaxial structure by reflecting the microwave (electromagnetic wave) radiated from the power supply antenna 90 by the reflecting plate 58. In that case, the length from the power supply antenna 90 to the reflecting plate 58 is preferably set to be substantially n*λ g/4, λ g being a guide wavelength and n being an odd number in order to effectively combine the microwave with the reflection wave.

However, this may not be applied to a microwave with a low frequency due to limit in the diametrical direction. In that case, a distance from the power supply antenna to the reflecting plate can be reduced by optimizing a shape of the power supply antenna 90 in such a way that an antinode of an electromagnetic wave to be generated from the power supply antenna 90 is formed below the power supply antenna 90 without being formed at the power supply antenna 90. In the case of using a microwave with a low frequency, the wave retardation member 59 made of a dielectric material such as Teflon (Registered Trademark) is provided between the power supply antenna 90 and the reflecting plate 58 in order to shorten an effective wavelength.

Figure 8:
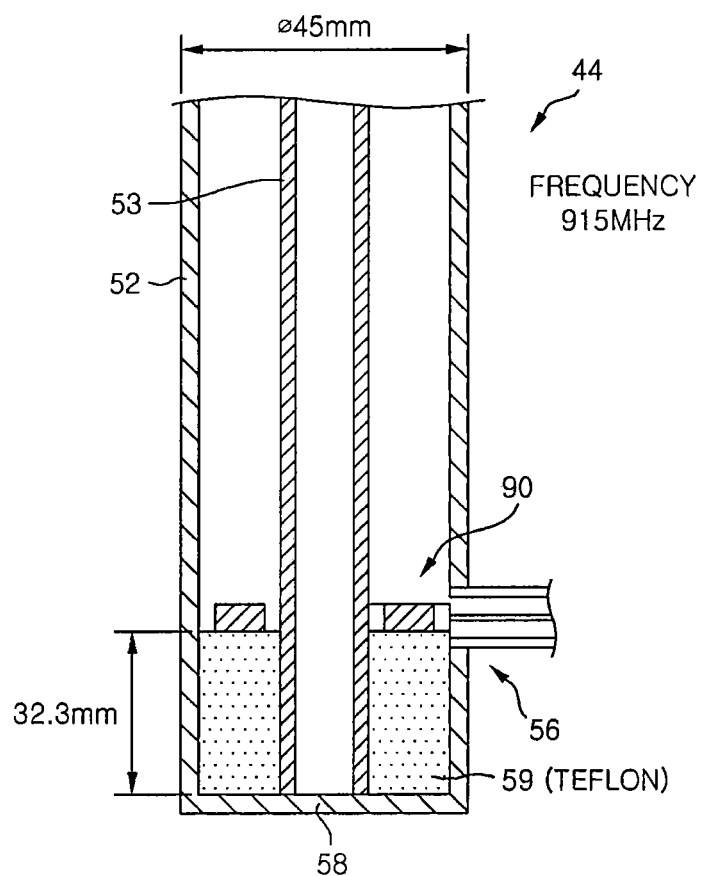
FIG. 8 schematically shows a configuration example for introducing a microwave having a frequency of about 915 MHz as an example of the electromagnetic-radiation power-supply mechanism of the present invention.

For example, as shown in FIG. 8, the diameter of the outer conductor 52 of the waveguide 44 was set to about 45 nm, and the distance between the reflecting plate 58 and the power supply antenna 90 was set to about 32.3 mm. The wave retardation member 59 made of a dielectric material such as Teflon (Registered Trademark) was provided therebetween in order to shorten an effective wavelength. Then, the microwave having a frequency of about 915 MHz was introduced from the coaxial line 56 through the power supply antenna 90. Therefore, a sufficient microwave power can be supplied from a single location even in the case of using a microwave with a low frequency.

Figure 9:
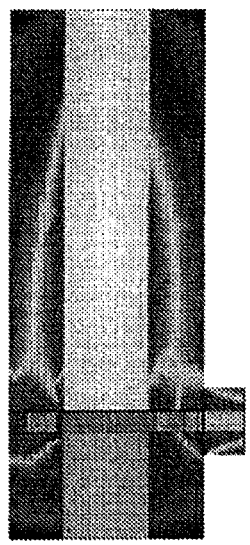
FIG. 9 shows a result of analyzing an electromagnetic field in the case of using the electromagnet-radiation power-supply mechanism shown in FIG. 8.

The microwave with a low frequency may not be effectively transmitted even by setting the distance between the power supply antenna 90 and the reflecting plate 58 to substantially n*λ g/4, λ g being a guide wavelength and n being an odd number. However, as can be seen from FIG. 9 showing the analysis result of the electromagnetic field in the case of using the electromagnet-radiation power-supply mechanism as shown in FIG. 8, in this example, an antinode of an electromagnetic wave transmitted from the power supply antenna 90 is formed at a vertical distance of about λ g/8 above the power supply antenna 90; an effective wavelength of the wave retardation member 59 is set to be about λ g/8; and a length from an antinode of an electromagnetic wave to the reflecting plate 58 is set to be substantially λ g/4. Thus, the reflection of the microwave by the reflecting plate 58 is maximized, and the maximum power is transmitted to the waveguide 44.

In the preset embodiment, a large-size isolator or a combiner is not necessary since the distributed microwaves are amplified individually by the main amplifier 47 constituting a solid state amplifier and radiated individually by the planar slot antenna 81, and then combined in the chamber 1.

The microwave introduction mechanism 41 is very compact because the antenna unit 43 and the tuner 60 are formed as one single unit. Therefore, it is possible to make the microwave plasma source 2 compact. The main amplifier 47, the tuner 60 and the planar slot antenna 81 are provided adjacent to one another. Especially, the tuner 60 and the planar slot antenna 81 can constitute a lumped constant circuit. Moreover, a plasma load can be tuned with high precision by the tuner 60 by setting to about 50Ω a combined resistance of the planar slot antenna 81, the wave retardation member 82, and the ceiling plate 83. The tuner 60 constitutes a slag tuner capable of matching an impedance simply by moving the two slags 61a and 61b and thus is compact and has low loss.

Since the tuner 60 and the planar slot antenna 81 are adjacent to each other, such an arrangement constitute a lumped constant circuit and function as a resonator, an impedance mismatch up to the planar slot antenna 81 can be resolved with high precision, and such a mismatching portion can practically be used as a plasma space. Accordingly, plasma control can be performed with high precision by the tuner 60.

The directivity of the microwave can be controlled by adjusting the phase in each of the antenna modules by the phase shifter 45 to thereby control the plasma distribution easily.

The components corresponding to the driving transmission unit, the driving guide unit and the supporting unit are provided inside the inner conductor 53 as shown in FIG. 3, so that the moment and the weight of the mechanical elements can be reduced compared to the case of providing such components outside the outer conductor 52. Further, it is unnecessary to provide a slit for allowing the supporting unit to pass therethrough at the outer conductor 52, and a shield mechanism for preventing a leakage of an electromagnetic wave becomes unnecessary. Accordingly, the driving mechanism of the slags 61a and 61b can be scaled down as compared to a conventional driving mechanism and the microwave introduction mechanism 41 can also be scaled down.

As described in conjunction with FIG. 3, the sliding member 63 made of a resin having a smoothness is inserted into the slags 61a and 61b. The screw mechanism is formed by screw-coupling the slag moving shaft 64a or 64b to the screw hole 65a of the sliding member 63. By rotating the slag moving shafts 64a and 64b by the motors 73a and 73b, the slags 61a and 61b are moved while the outer periphery of the sliding member 63 is guided to slide along the inner periphery of the inner conductor 53. Accordingly, the sliding member 63 and the slag moving shafts 64a and 64b perform the functions of the driving transmission mechanism, the driving guide mechanism and the supporting mechanism. As a result, it is possible to make the driving mechanism remarkably compact, and the tuner 60 can be further scaled down.

The sliding member 63 has a through hole 65b, and a slag moving shaft which is not screw-coupled to the screw hole 65a passes through the through hole 65b. Thus, two slag moving shafts 64a and 64b for respectively driving the slags 61a and 61b can be provided inside the inner conductor 53, and the two slags 61a and 61b can be individually moved by the screw mechanism. In the slag driving unit 70, the motors 73a and 73b, and the gears 72a and 72b serving as a power transmission mechanism are vertically offset from each other. Accordingly, the space for the power transmission mechanism including the motors, the gears and the like can be reduced, and the housing body 71 for accommodating such components can have the same diameter as that of the outer/inner conductor 52. As a consequence, it is possible to make the tuner 60 more compact.

Positions of the slags 61a and 61b are detected by providing increment encoders 75a and 75b in such a way as to be directly coupled to the output shafts of the motors 73a and 73b, respectively. Therefore, a conventional position detection sensor becomes unnecessary, and an expensive absolute type encoder is not required, which is cost effective.

(Embodiment in Which Incident Wave/Reflected Wave Monitor are Provided)

Hereinafter, another embodiment in which an incident wave/reflected wave monitor is provided will be described.

Figure 10:
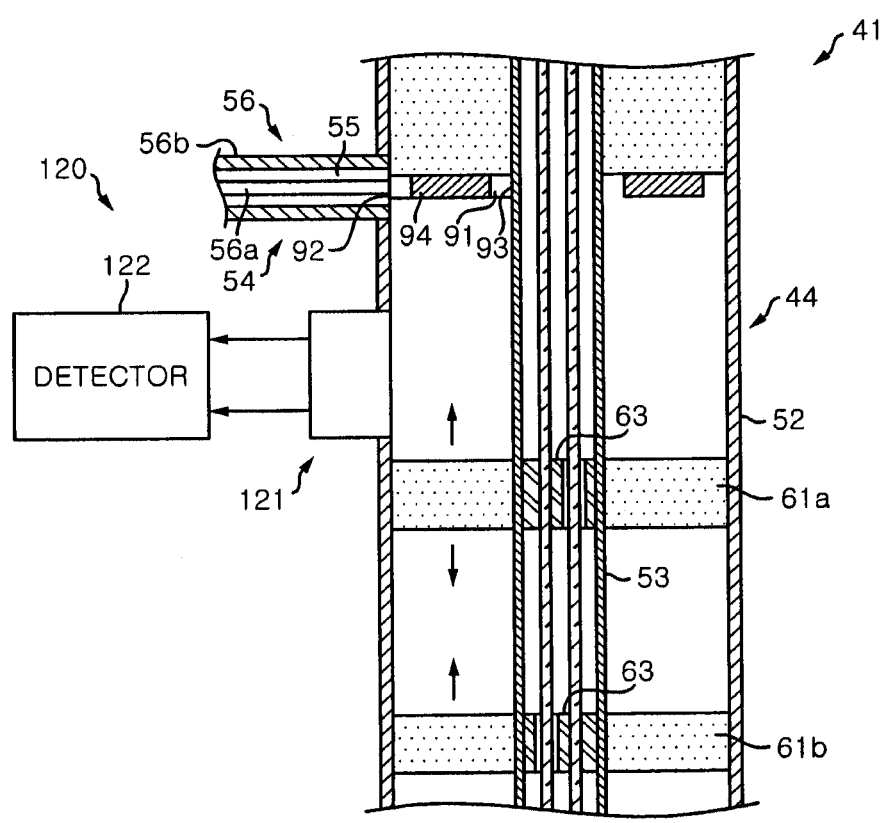
FIG. 10 is a cross sectional view showing a microwave introduction mechanism including an incident wave/reflected wave monitor.

An incident wave/reflected wave monitor 120 serves to monitor an incident wave transmitted from the microwave supply unit 40 to the chamber 1 and a reflected wave returning to the microwave supply unit 40 by being reflected without contributing to plasma generation. Generally, the plasma processing apparatus using a microwave is provided with the incident wave/reflected wave monitor. As shown in FIG. 10, in the present embodiment, the incident wave/reflected wave monitor 120 has a directional coupler 121 capable of extracting a current of a microwave of either an incident wave or a reflected wave and a detector 122 for detecting the current extracted by the directional coupler 121.

Conventionally, as an independent member, the directional coupler used for the incident wave/reflected wave monitor is generally connected to the apparatus at the time of completion of fabrication of the apparatus. In that case, the number of components is increased and, thus, the demand for miniaturization cannot be satisfied. Meanwhile, the directional couple is generally provided at the waveguide for the microwave, and may be provided at the waveguide 44 of the microwave introduction mechanism 41. Therefore, in the present embodiment, the directional coupler 121 is assembled to the microwave introduction mechanism 41 as one unit, thereby solving the above drawback.

Figure 11:
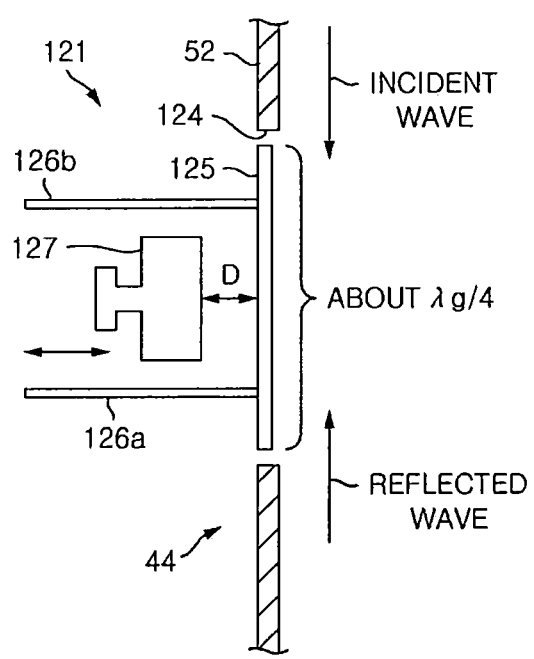
FIG. 11 is a cross sectional view schematically showing a structure of a directional coupler used in the incident wave/reflected wave monitor.

A specific configuration of the directional coupler 121 will be described with reference to FIG. 11. As shown in FIG. 11, the directional coupler 121 includes: a slit 124 formed at the outer conductor 52 of the microwave introduction mechanism 41; a rectangular plate-shaped conductor 125 provided in the slit 124, the conductor 125 having a length of about $\lambda_g/4$; two conductive pins 126a and 126b respectively connected to the vicinity of opposite lengthwise end portions of the plate-shaped conductor 125 and extending toward the outer side of the outer conductor 52; and a regulator 127 made of a conductor, provided between the conductive pins 126a and 126b, in such a way that a position with respect to the plate-shaped conductor 125 is controlled by a screw.

A magnetic field is induced by an incident wave and a reflected wave transmitted through the waveguide 44, and a current produced by the induced magnetic field flows through the plate-shaped conductor 125. In the case of detecting a reflected wave, a current produced by an incident wave is canceled out by a magnetic field generated by a periodic electric field generated at the plate-shaped conductor 125 and the regulator 127 and, thus, a current produced by a reflected wave mainly flows. Meanwhile, in the case of detecting an incident wave, a current produced by a reflected wave is canceled out by a magnetic field generated by a periodic electric field generated at the plate-shaped conductor 125 and the regulator 127 and, thus, a current produced by an incident wave mainly flows.

The current flowing through the plate-shaped conductor 125 is extracted by the conductive pins 126a and 126b, and the extracted current is detected by the detector 122. The current detected by the detector 122 is converted to a voltage signal and transmitted to the control unit 110.

By monitoring the reflected wave, the power reflected from the plasma can be detected. Similarly, by monitoring an incident wave, the incident power that is actually inputted to the plasma can be detected. By performing an operation of the signals of the incident wave and the reflected wave, a reflection coefficient and a phase can be obtained. The obtained results are sent to the control unit 110 and fed back to the slag controller 68, thereby performing an impedance matching. When the reflection coefficient calculated by the detector 122 is greater than or equal to a predetermined value or a predetermined period of time, the control unit 110 can send an output stop signal to the microwave oscillator 32 to stop the supply of the microwave.

In the case of monitoring an incident wave, the directional coupler 121 is provided between the microwave power introduction port 55 and the slag 61a as shown in FIG. 10, so that the impedance matching can be performed in a state where disturbance factors are reduced. Meanwhile, in the case of monitoring a reflected wave, the directional coupler 121 may be positioned as shown in FIG. 10. However, by providing the directional coupler 121 between the slag 61b and the antenna unit 43, the reflection from the plasma can be directly detected, so that the reflected wave can be detected with high precision. One directional coupler for monitoring an incident wave may be positioned as shown in FIG. 10, and another directional coupler for monitoring a reflected wave may be positioned between the slag 61b and the antenna unit 43.

The regulator 127 can adjust a distance D to the plate-shaped conductor 125 by using a screw from outside in order to minimize a design error and/or an installation error of the incident wave/reflected wave monitor. A conventional regulator is disadvantageous in that an adjustment range, i.e., an attenuation rate, is small. The examination result shows that this is because, as shown in FIG. 12A, a slit 124' formed at an outer conductor of a conventional directional coupler 121' has a length and a width that are substantially the same as those of a plate-shaped conductor 125' and the coupling between an induced magnetic field and a regulator 127' is not sufficient.

Figure 12A:
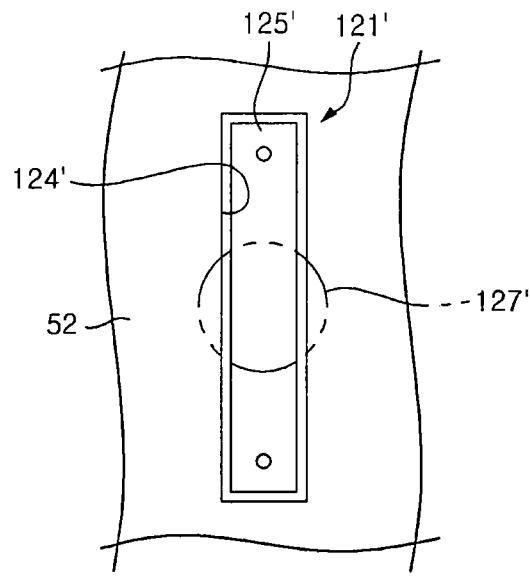
FIG. 12A is a front view schematically showing a conventional directional coupler.
Figure 12B:
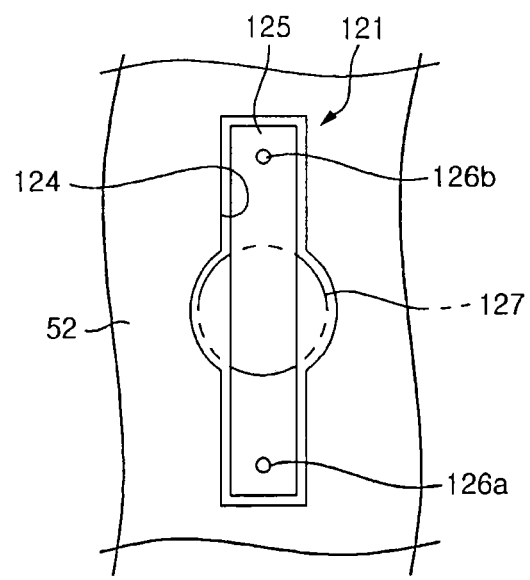
FIG. 12B is a front view schematically showing the directional coupler shown in FIG. 11.

In the present embodiment, as shown in FIG. 12B, the slit 124 is formed in such a shape that a portion of the slit 124 facing the regulator 127 is widened to correspond to the regulator 127. Therefore, the coupling between the induced magnetic field and the regulator 127 can be increased and, thus, a variation width of an induced current can be increased by adjusting the distance D by the regulator 127 to thereby widen the adjustment range of the regulator 127. Here, if the width of the slit 124 is excessively increased, a leakage current is increased, which is not preferable. Hence, it is necessary to prevent an excessive increase of the portion of the slit 124 which corresponds to the regulator 127.

Figure 13A:
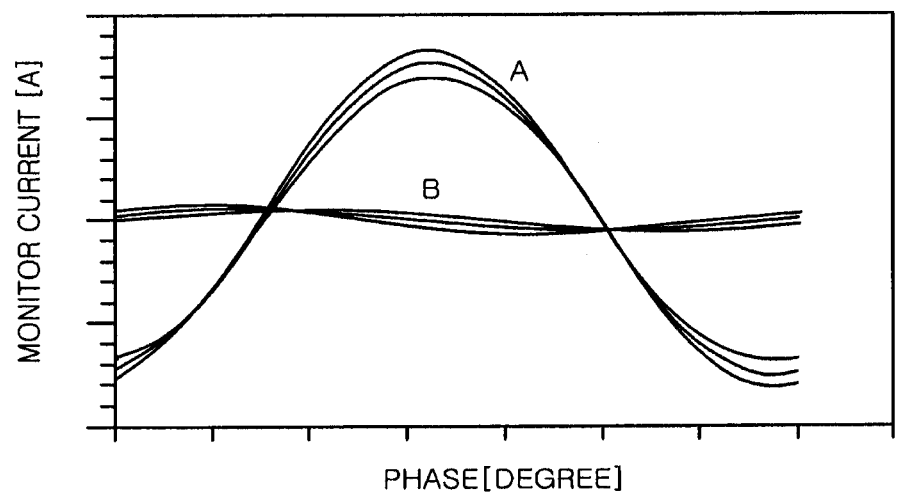
FIG. 13A shows a relationship between a phase and a current of an incident wave and a reflected wave in the case of using the incident wave/reflected wave monitor in accordance with the embodiment of the preset invention.
Figure 13B:
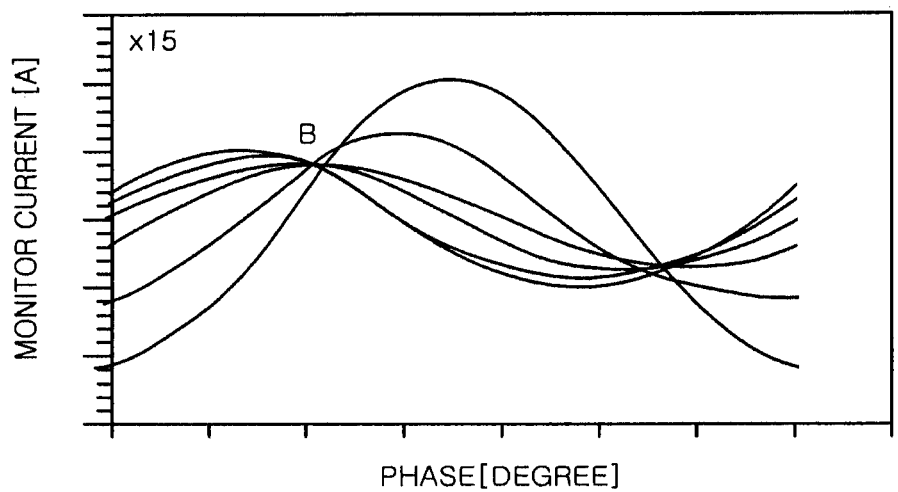
FIG. 13B is an enlarged view of a part of the reflected wave shown in FIG. 13A.
Figure 13C:
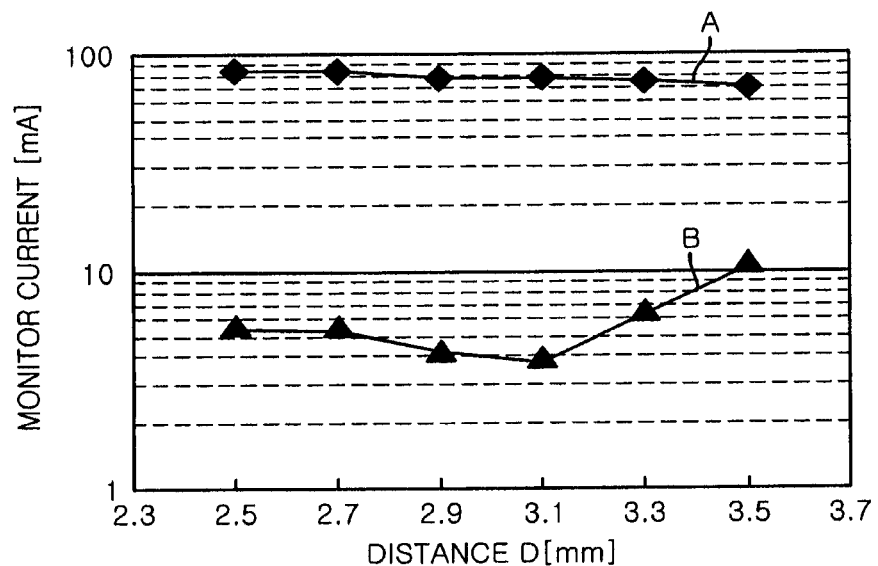
FIG. 13C shows a relationship between a monitor current and a distance D of an incident wave and a reflected wave in the case of using the incident wave/reflected wave monitor in accordance with the embodiment of the present invention.
Figure 13D:
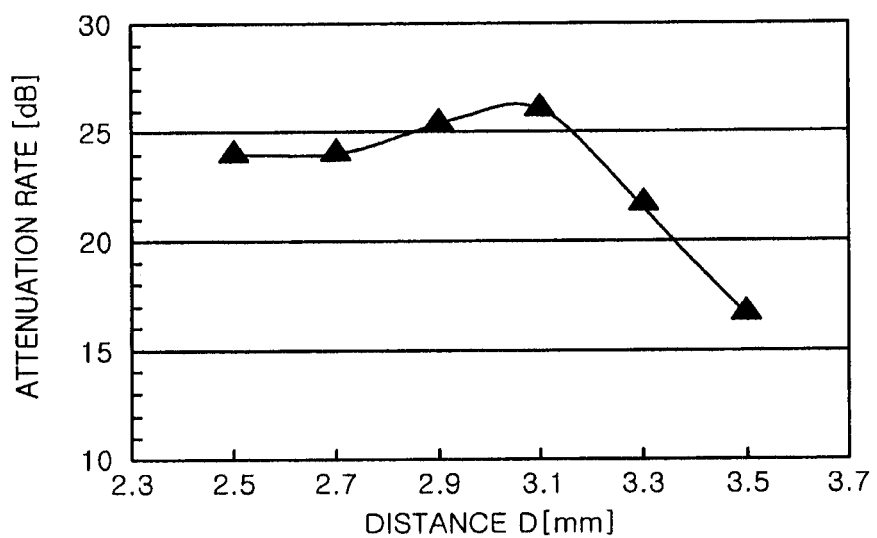
FIG. 13D shows a relationship between the distance D and an attenuation rate in the case of using the incident wave/reflected wave monitor.

In the cases where the incident wave/reflected wave monitor of the present embodiment and the conventional incident wave/reflected wave monitor were respectively attached to waveguides, a monitor current and an attenuation rate were actually measured by inputting a microwave of about 1000 W to each of the waveguides. FIGS. 13A to 13D show the results obtained in the case of using the incident wave/reflected wave monitor of the present embodiment shown in FIG. 12B. Specifically, FIG. 13A shows a relationship between a phase in degree and a monitor current in amps (A) of an incident wave and a reflected wave. FIG. 13B is an enlarged view of a part of the reflected wave shown in FIG. 13A. FIG. 13C shows a relationship between a distance D in mm and a monitor current in mA of the incident wave and the reflected wave. FIG. 13D shows a relationship between the distance D in mm and an attenuation rate in db.

Figure 14A:
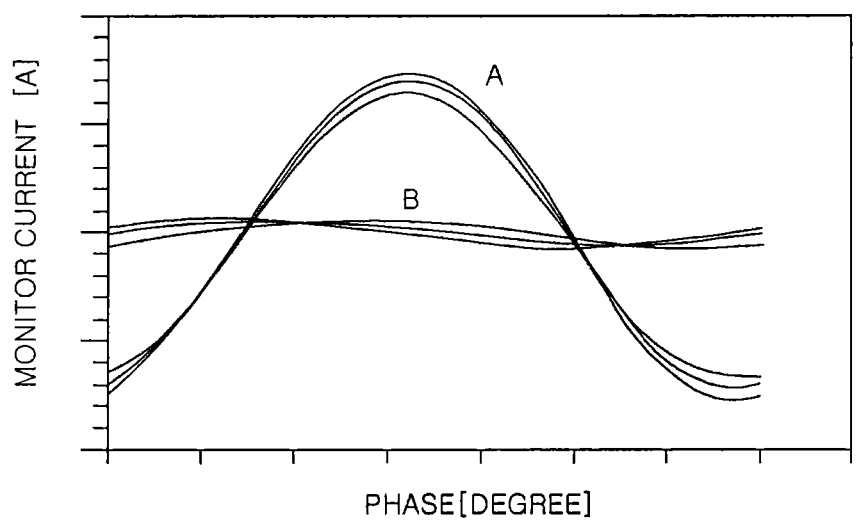
FIG. 14A shows a relationship between a phase and a current of an incident wave and a reflected wave in the case of using a conventional incident wave/reflected wave monitor.
Figure 14B:
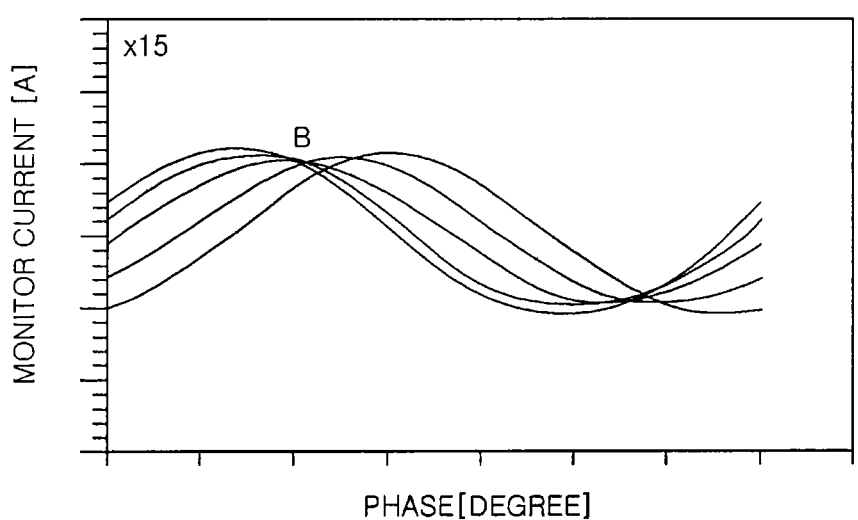
FIG. 14B is an enlarged view of a part of the reflected wave shown in FIG. 14A.
Figure 14C:
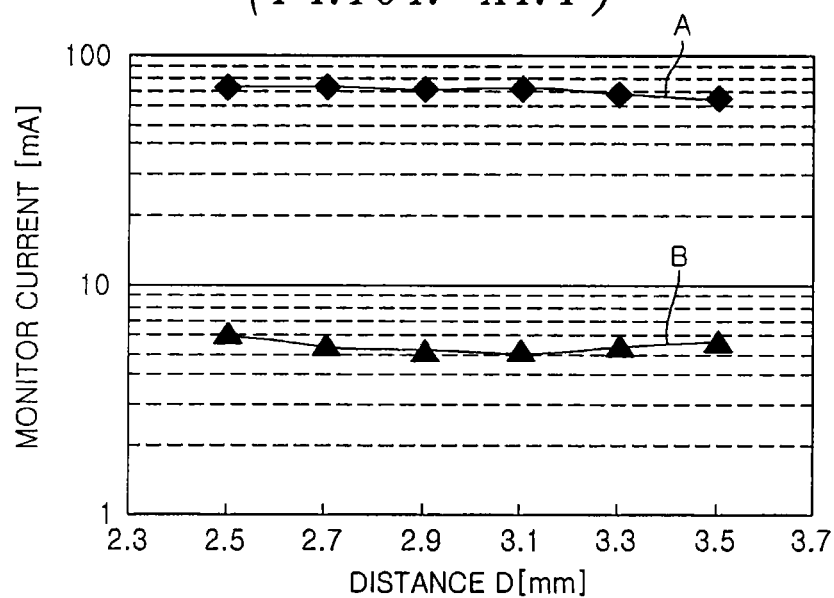
FIG. 14C shows a relationship between a monitor current and a distance D of an incident wave and a reflected wave in the case of using the conventional incident wave/reflected wave monitor.
Figure 14D:
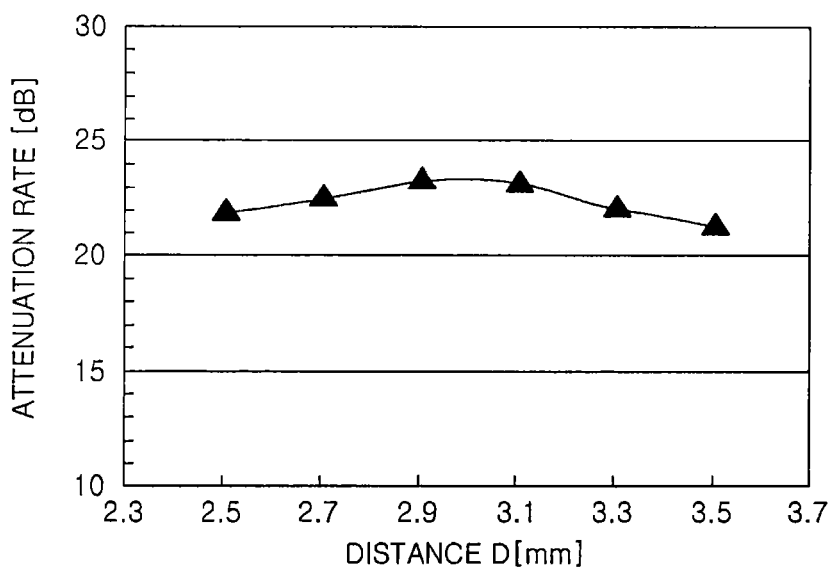
FIG. 14D shows a relationship between the distance D and an attenuation rate in the case of using the conventional incident wave/reflected wave monitor.

FIGS. 14A to 14D show the results obtained in the case of using the conventional incident wave/reflected wave monitor shown in FIG. 12A. Specifically, FIG. 14A shows a relationship between a phase in degree and a monitor current in amps (A) of the incident wave and the reflected wave. FIG. 14B is an enlarged view of a part of the reflected wave shown in FIG. 14A. FIG. 14C shows a relationship between a distance D in mm and a monitor current in mA of the incident wave and the reflected wave. FIG. 14D shows a relationship between the distance D in mm and an attenuation rate in db. In the above-described drawings, a notation "A" indicates a current of the incident wave and a notation "B" indicates a current of the reflected wave. When the current A and the current B are indicated as $I_A$ and $I_B$, respectively, an attenuation rate γ is calculated by the following equation.

$$\gamma = -20\log(I_A/I_B)$$

As can be seen from the above drawings, in the present embodiment, the change in the distance between the regulator 127 and the plate-shaped conductor 125 leads to a remarkable increase in the variation of the attenuation rate and the adjustment range of the regulator 127, compared to the prior art.

(Other Embodiments)

While the invention has been shown and described with respect to the embodiments, it will be understood by those skilled in the art that various changes and modifications may be made without departing from the scope of the invention as defined in the following claims.

For example, the configuration of the microwave output section 30 or the microwave supply unit 40 is not limited to that described in the above-described embodiments. Specifically, the phase shifter is not required when it is unnecessary to control the directivity of the microwave radiated from the antenna or to form a circularly polarized wave. Further, the microwave supply unit 40 does not necessarily have a plurality of microwave introduction mechanisms 41, and a single microwave introduction mechanism 41 may be provided. Although the case in which the planar slot antenna 81 has two or four fan-shaped slots 81a has been described, various slot patterns may be employed depending on conditions without being limited to the above-described slot pattern.

In the above-described embodiments, the etching apparatus is used as the plasma processing apparatus. However, the plasma processing apparatus may be used for another plasma processing such as film formation, oxynitriding, ashing or the like without being limited thereto. Further, a target substrate to be processed is not limited to the semiconductor wafer W, and may be another substrate such as a FPD (flat panel display) represented by a LCD (liquid crystal display), a ceramic substrate or the like.

What is claimed is:

1. An electromagnetic-radiation power-supply mechanism for supplying an electromagnetic wave power to a coaxial waveguide, the mechanism comprising:
   a microwave power introduction port provided on a side of the coaxial waveguide, a power line being connected to the microwave power introduction port; and
   a power supply antenna for radiating the electromagnetic wave power into the waveguide, the power supply antenna being connected to the power line,
   wherein the power supply antenna includes: an antenna body having a first pole connected to the power line and a second pole connected to an inner conductor of the waveguide; and a ring-shaped reflection portion extending from opposite sides of the antenna body along an outer side of the inner conductor, and
   a first electromagnetic wave that is incident on the antenna body and a second electromagnetic wave reflected by the reflection portion to form a standing wave, and the electromagnetic wave power propagates in the waveguide by chain reactions of an induced electric field and an induced magnetic field caused by the standing wave.

2. The electromagnetic-radiation power-supply mechanism of claim 1, further comprising:
   a reflecting plate provided at a side of the waveguide opposite to a propagation direction of the electromagnetic wave power, wherein the electromagnetic wave power supplied from the power supply antenna is reflected by the reflecting plate and propagates in the waveguide.

3. The electromagnetic-radiation power-supply mechanism of claim 2, further comprising: a wave retardation member, provided between the reflecting plate and the power supply antenna, for shortening an effective wavelength of the electromagnetic wave power which propagates between the reflecting plate and the power supply antenna 4. A microwave introduction mechanism used for a surface wave plasma source for generating a surface wave plasma in a chamber, the mechanism comprising:
   a coaxial waveguide;
   a power introduction port provided on a side of the coaxial waveguide, a coaxial line being connected to the power introduction port;
   a power supply antenna for radiating an electromagnetic wave power into the waveguide, the power supply antenna being connected to an inner conductor of the coaxial line; and
   an antenna unit having a microwave radiation antenna for radiating a microwave supplied to the waveguide into the chamber,
   wherein the power supply antenna includes: an antenna body having a first pole connected to the coaxial line and a second pole which contacts an inner conductor of the waveguide; and a reflection portion formed in a ring shape and extending from opposite sides of the antenna body along an outer side of the inner conductor, and a first electromagnetic wave that is incident on the antenna main body and a second electromagnetic wave reflected by the reflection portion to form a standing wave, and the electromagnetic wave power propagates in the waveguide by chain reactions of an induced electric field and an induced magnetic field caused by the standing wave.

5. The microwave introduction mechanism of claim 4, further comprising: a reflecting plate provided at a side of the waveguide opposite to a propagation direction of the electromagnetic wave power, and the electromagnetic wave power supplied from the power supply antenna is reflected by the reflecting plate and propagates in the waveguide.

6. The microwave introduction mechanism of claim 5, further comprising: a wave retardation member, provided between the reflecting plate and the power supply antenna, for shortening an effective wavelength of the electromagnetic wave power which propagates between the reflecting plate and the power supply antenna.

7. The microwave introduction mechanism of claim 4, further comprising:

an incident wave/reflected wave monitor including a directional coupler provided in the waveguide, for extracting a current of either an incident wave directed to the chamber or a reflected wave which returns by being reflected among microwaves propagating in the waveguide and a detector for detecting the current extracted by the directional coupler.

8. The microwave introduction mechanism of claim 7, wherein the directional coupler includes: a slit formed at an outer conductor of the coaxial waveguide; a plate-shaped conductor provided in the slit; a pair of conductive pins for extracting a current flowing in the plate-shaped conductor; and a regulator including a conductor which is provided outside the outer conductor to correspond to the plate-shaped conductor in such a way that a distance between the regulator and the plate-shaped conductor is adjustable, and wherein the slit is formed in such a shape that a portion of the slit facing the regulator is widened to correspond to the regulator.

9. The microwave introduction mechanism of claim 7, further comprising: a tuner, provided between the power introduction port and the antenna unit, for matching an impedance of a load in the chamber to a characteristic impedance of a microwave power supply installed at the surface wave plasma source, wherein the tuner includes an annular slag made of a dielectric material, the annular slag being provided between the outer conductor and the inner conductor to be movable along a lengthwise direction of the inner conductor, and the directional coupler is provided between the power introduction port and the slag and/or between the slag and the antenna unit.

* * * * *